(12) United States Patent
Overweg et al.

(10) Patent No.: US 10,018,690 B2
(45) Date of Patent: Jul. 10, 2018

(54) PHANTOM BASED MR FIELD MAPPING OF THE POLARIZING MAGNETIC FIELD

(71) Applicants: KONINKLIJKE PHILIPS N.V., Eindhoven (NL); PHILIPS DEUTSCHLAND GMBH, Hamburg (DE)

(72) Inventors: Johannes Adrianus Overweg, Eindhoven (NL); Kay Nehrke, Eindhoven (NL)

(73) Assignee: KONINKLIJKE PHILIPS N.V., Eindhoven (NL)

( * ) Notice: Subject to any disclaimer, the term of this patent is extended or adjusted under 35 U.S.C. 154(b) by 477 days.

(21) Appl. No.: 14/652,836

(22) PCT Filed: Dec. 11, 2013

(86) PCT No.: PCT/IB2013/060809
§ 371 (c)(1),
(2) Date: Jun. 17, 2015

(87) PCT Pub. No.: WO2014/097056
PCT Pub. Date: Jun. 26, 2014

(65) Prior Publication Data
US 2015/0338475 A1 Nov. 26, 2015

Related U.S. Application Data

(60) Provisional application No. 61/738,489, filed on Dec. 18, 2012.

(51) Int. Cl.
*G01V 3/00* (2006.01)
*G01R 33/28* (2006.01)
(Continued)

(52) U.S. Cl.
CPC .......... *G01R 33/243* (2013.01); *G01R 33/34* (2013.01); *G01R 33/385* (2013.01); *G01R 33/58* (2013.01)

(58) Field of Classification Search
CPC ................................ G01R 33/28; G01R 33/44
(Continued)

(56) References Cited

U.S. PATENT DOCUMENTS

| 4,585,992 A | 4/1986 | Maudsley et al. |
| 4,749,948 A | 6/1988 | Duby et al. |

(Continued)

FOREIGN PATENT DOCUMENTS

JP          0453533 A    2/1992

*Primary Examiner* — Bot Ledynh

(57) ABSTRACT

The present invention provides a phantom (200) for use in a magnetic resonance (MR) imaging system (110) with a set of resonating volumes (206) positioned in a base body (202), whereby the base body (202) has a spherical or ellipsoid shape in accordance with a volume of interest (203) of the MR imaging system (110), and the resonating volumes (206) are located at a circumference of the base body (202). The phantom is used in a method for evaluating the magnetic field of a main magnet (114) of a magnetic resonance (MR) imaging system (110), comprising the steps of positioning the phantom (200) within the main magnet (114), performing a 3D spectroscopic MR measurement of the phantom (200) using the MR imaging system (110), thereby measuring resonances of the resonating volumes (206), assigning the measured resonances to the resonating volumes (206), and evaluating the magnetic field of the main magnet (114) from the MR measurement of the phantom (200) based on the measured resonances of the resonating volumes (206). Accordingly, the MR imaging system itself is directly used for determining the magnetic field of its main magnet. Accordingly, the MR imaging system itself can be used as (Continued)

measurement equipment, instead of a separate NMR magnetometer, which is required for conventional determination of the magnetic field.

19 Claims, 4 Drawing Sheets

(51) Int. Cl.
*G01R 33/44* (2006.01)
*G01R 33/24* (2006.01)
*G01R 33/385* (2006.01)
*G01R 33/34* (2006.01)
*G01R 33/58* (2006.01)

(58) Field of Classification Search
USPC .................................................. 324/309, 318
See application file for complete search history.

(56) References Cited

U.S. PATENT DOCUMENTS

| | | | |
|---|---|---|---|
| 4,949,043 A | 8/1990 | Hillenbrand et al. | |
| 5,055,791 A | 10/1991 | LeRoux et al. | |
| 5,351,006 A | 9/1994 | Sumanaweera et al. | |
| 7,443,164 B2 | 10/2008 | Clarke et al. | |
| 7,683,623 B2* | 3/2010 | Zhai | G01R 33/34046 324/318 |
| 2007/0219443 A1* | 9/2007 | Ehnholm | A61B 5/055 600/414 |
| 2012/0249141 A1* | 10/2012 | Blumhagen | G01R 33/56563 324/309 |

* cited by examiner

PHANTOM BASED MR FIELD MAPPING OF THE POLARIZING MAGNETIC FIELD

CROSS-REFERENCE TO PRIOR APPLICATIONS

This application is the U.S. National Phase application under 35 U.S.C. § 371 of International Application No. PCT/IB2013/060809, filed on Dec. 11, 2013, which claims the benefit of U.S. Patent Application No. 61/738489, filed on Dec. 18, 2012. These applications are hereby incorporated by reference herein.

FIELD OF THE INVENTION

The invention relates to the field of magnetic resonance (MR) imaging systems, and in particular to the area of MR magnetic field mapping for MR imaging systems.

BACKGROUND OF THE INVENTION

In magnetic resonance (MR) imaging systems, a main magnet is used to generate a strong static magnetic field. In order to perform MR measurements with a good accuracy, it is required that the static magnetic field is homogenous in a volume of interest. The volume of interest corresponds to an examination space of the MR imaging system and is typically a spherical or ellipsoid space with a diameter of about 50 centimeters. A variation of the static magnetic field within the volume of interest of less than 20 ppm is generally required. Before field homogeneity correction (otherwise known as shimming), a typical main magnet can have an inhomogeneity of about 500 ppm. Adjustment of the magnetic field is required, e.g. by adding magnetic material within the main magnet or by setting appropriate currents in adjustment coils. Before such corrections can be made, an accurate measurement of the magnetic field inside the magnet is needed.

Determining the static magnetic field inside the volume of interest which is usually a sphere or spheroid space located in the centre of the magnet, is also referred to as field mapping. This field mapping of an MR imaging system involves accurate determination of the magnetic field in a large number of locations. In known methods for determining the static magnetic field, the field is sampled over a closed surface bounding the volume of interest; if the field on the surface of the volume of interest is known, it can be reconstructed inside the entire volume enclosed by this surface. Measurements of the magnetic field are performed in 12-24 concentric circles about the longitudinal axis of the main magnet, also referred to as z-axis. Each circle is provided in a plane rectangular to the z-axis, and the measurements are provided in an angular distance of 15-30 degrees around the z-axis.

Conventional measurement methods employ a Nuclear Magnetic Resonance (NMR) magnetometer or an array of such magnetometers. The NMR magnetometer is moved within the static magnetic field of the main magnet to desired sample locations in order to perform the required measurements as specified above. The movement is realized by use of a holding apparatus, which is usually mechanically operated in order to reduce influences on the static magnetic field.

The NMR magnetometer and the holding apparatus to move the NMR magnetometer(s) are complicated to handle and expensive. The method for mapping the MR magnetic field using the NMR magnetometer and the holding apparatus is time consuming and also difficult to execute. Accordingly, an improvement is desired.

An additional problem arises since the static magnetic field is influenced by the location where the MR imaging (MM) system containing the main magnet is located. Therefore, the homogeneity of the main magnet has to be verified every time the MRI system is moved, in particular when the system is installed at a new location. Accordingly, availability of the NMR magnetometer and the holding apparatus are reduced by way of transport time, and there is an increased risk of damaging or loss of the NMR magnetometer and the holding apparatus during transport. The same problem arises each time maintenance of the main magnet has to be performed, i.e. each time the static magnetic field is calibrated.

SUMMARY OF THE INVENTION

It is an object of the invention to facilitate the mapping of a main magnet of a magnetic resonance (MR) imaging system.

In one aspect of the present invention, the object is achieved by a method for evaluating the magnetic field of a main magnet of a magnetic resonance (MR) imaging system, comprising the steps of providing a phantom with a set of resonating volumes positioned in a base body, whereby the base body has a spherical or ellipsoid shape in accordance with a volume of interest of the MR imaging system, and the resonating volumes are located at a circumference of the base body, positioning the phantom within the main magnet, performing a 3D spectroscopic MR measurement of the phantom using the MR imaging system, thereby measuring resonances of the resonating volumes, assigning the measured resonances to the resonating volumes, and evaluating the magnetic field of the main magnet from the MR measurement of the phantom based on the measured resonances of the resonating volumes.

The 3D spectroscopic MR measurement refers to a measurement of precise resonance frequencies at each measurement point. The 3D spectroscopic MR measurement is performed such that each of the individual resonant volumes can be identified and such that the NMR resonance frequency of each of the resonance volumes is obtained. The particular frequency of a magnetic resonance of a resonating volume indicates the strength of the magnetic field at the location of the resonating volume. With the magnetic field known at the circumference of the volume of interest, the static magnetic field within the entire volume of interest can be fully determined. All spatial information is obtained by using phase encoding gradients. Using a measurement sequence with only phase-encoding gradients, the geometric distortion of the measurement is only determined by gradient non-linearity. In each individual measurement, also referred to as phase encoding step, a point in the 3D acquisition space, also referred to as k-space, is acquired. From the 3D k-space data, the signals in the 3D spatial domain can be mathematically reconstructed. According to a preferred embodiment, the data are sampled on a regular 3D grid, allowing signal reconstruction on a regular 3D grid in the spatial domain by a Fast Fourier Transform.

The set of measurements is preferably processed by a computer such as to produce a table, assigning a measured field value to each of the locations of the resonant volumes. This field map can then be further processed to analyze the characteristics of the field inside the volume of interest and to determine corrective actions required to make the field of the magnet homogeneous.

In order to speed up the spectroscopic MR measurement, a resolution can be chosen in the x, y and z-direction of the MR imaging system to be sufficient to identify the resonating volumes. A preferred resolution suitable for the spectroscopic MR measurement contains 80 to 200 measurement samples per axis in the x/y-plane and 1 to 30 samples in the z-direction. Further preferred, about 120×120 individual measurement samples are taken in the x/y-plane and about 10 samples are taken along the z-axis. With the known structure of the phantom, i.e. the known positions of the resonating volumes, the spectroscopic measurement can be performed and the resonating volumes can be matched to measured resonances in the 3D spectroscopic MR measurement. Preferably, the exact position is derived from the known structure of the phantom. Accordingly, an accurate placement of the phantom in the volume of interest is required. Using this phantom, the MR imaging system can be used directly for determining the magnetic field of its main magnet. Therefore, the MR imaging system itself can be used as measurement equipment, instead of a separate NMR magnetometer, which is required for conventional determination of the magnetic field. This measurement is much cheaper and more reliable than a measurement with a dedicated magnetometer system. Furthermore, the measurement results can be directly used for a calibration of the MR imaging system, if the measurement is performed by the MR imaging system itself. An accurate placement of the phantom with the planes having the required x/y-orientation is required. Typically, an accuracy of 2 to 3 mm is required for each degree of freedom, i.e. the x, y, z-axis and the three rotational axis.

The base body of the provided phantom is preferably made of plastics, e.g. of polycarbonate. The base body can have any suitable structure. Preferably, it is provided as an essentially hollow body. Alternatively, resonating volumes can be interconnected within the base body, with the resonating volumes defining the shape of the base body. In an alternative embodiment, the base body is made of another non-electrically conducting material with a low magnetic susceptibility, The resonating volumes are provided within the base body. Preferably, the resonating volumes are provided by enclosures of a resonating medium within the base body. The resonating medium is a medium generating a magnetic resonance when subjected to the appropriate combination of a static magnetic field and a RF field. The resonating volumes have any size and shape suitable to be easily detected as separate volumes. Preferably, the resonating volumes have a spherical shape with a diameter of less than one centimeter, further preferred with a diameter of two to three millimeters. The base body can be provided with bores, which are filled with the resonating medium and sealed afterwards. Preferably, the resonating medium is water. Since the resonating volumes are provided at the circumference of the base body, a magnetic field at this circumference can be evaluated.

The circumferential magnetic field is suitable to determine the magnetic field within the entire phantom, i.e. the volume enclosed by the set of sample volumes. Accordingly, only a low number of resonating volumes is required. Resonating volumes within the entire circumference of the phantom are not required. Preferably, the resonating volumes are evenly distributed over the circumference of the base body and have the same volume. A typical volume of interest within a whole-body MR imaging system has a spherical shape with a diameter of about 50 cm. For this typical volume of interest it is preferred to provide the phantom with at least 100 resonating volumes. Further preferred, the number of resonating volumes is at least 200. This enables a sufficient mapping of the magnetic field without excessive measuring effort, since the measuring effort increases with the number of resonating volumes.

According to a preferred embodiment the step of assigning the measured resonances to the resonating volumes comprises identifying the measured resonances in the spatial domain. Hence, the resonating volume can be identified based on the position where it appears in the 3D image. The position is characterized by an angular and a radial position and a distance from the z=0 plane. In particular, the effect of backfolding can be used to perform combined measurements for resonating volumes in different locations in the longitudinal direction of the MR imaging system, i.e. in the z-axis. Due to the backfolding effect, measurements of resonating volumes of different z-positions can be seen in one measurement of the z-axis. This method is in contrast to conventional measurements, where the volume of the phantom is fully within the 3D scan volume and the number of phase encoding steps is large enough to resolve all resonant volumes, thus avoiding backfolding. Due to the known positions of the resonating volumes of the phantom, the number of measurements in the z-axis can be reduced to speed up the measurement. Nevertheless, the frequency for all resonating volumes can be obtained from the measurements and the magnetic field can be fully determined based on a reduced number of phase encoding steps in the z-axis and the selected size of the 3D imaging volume, which is preferably smaller than the extent of the phantom in z-direction. Further preferred, the phantom is provided with the resonating volumes arranged in parallel planes, so that all resonating volumes can be measured with a minimum number of phase encoding steps in z-direction. Further preferred, the volumes can be distinguished due to their position within the phantom, i.e. a rotational angle of the resonating volumes of a ring compared to the resonating volumes of different ring.

According to a preferred embodiment the step of assigning the measured resonances to the resonating volumes comprises generating a catch zone for each resonating volume within the 3D spectroscopic MR measurement. The frequency of the spectroscopic measurement within this catch zone is then used as spectroscopic measurement from the resonating volume corresponding to the catch zone. This allows a reduction of the resolution of the spectroscopic MR measurement, and the time for determining the static magnetic field can be reduced. Depending on the kind of used phantom, two- or three-dimensional catch zones can be defined for each resonating volume. Preferably, the catch zone is a two-dimensional zone, further preferred a zone in the x/y-plane of the MR imaging system. When the resonating volumes are positioned in x/y-planes, the z-position of the catch zone is predefined, so that catching along the z-axis is not required. The distances in the z-direction are sufficiently large to distinguish resonating volumes of the different planes.

According to a preferred embodiment the step of providing a phantom comprises providing the phantom with the resonating volumes being arranged in different planes, which are arranged in parallel to each other. Accordingly, the resonating volumes are arranged in circular or elliptic rings. The arrangement in planes facilitates the manufacturing of the phantom and the placement of the phantom within the volume of interest. The arrangement can be realized by placing the resonating volumes of each plane in a circular, elliptic, or annular structure, whereby the structures of all planes are connected together to form the phantom. The planes can be provided with a constant distance between each pair of planes, or the distance can be different for different pairs of planes. Further preferred, the locations of the rings correspond to the foot-points of an $n^{th}$ order Gaussian integration in θ direction, where θ is the spherical angular coordinate in the z-r plane and n is the number of rings. These angles are the zero points of the Legendre polynomial of order n. Preferably, the structure is a ring having a homogenous cross section in its circumferential direction such that all resonating volumes have the same susceptibility-related frequency shift. Further preferred, all resonating volumes are provided in ring structures having the same cross section. A preferred phantom has 20 to 30 planes, further preferred 24 planes. Preferably, each plane has a maximum of 20 to 30 resonating volumes. Since the center region of the phantom has a bigger diameter than its border region, it is preferred that the planes of the center region are provided with a higher number of resonating volumes compared to the border regions. In the method, the step of placing the phantom in the MR scanner comprises aligning the phantom, such that the rings are approximately coaxial with the longitudinal axis of the main magnet and the symmetry plane perpendicular to the axis or rotational symmetry of the phantom approximately coincides with the corresponding symmetry plane of the main magnet.

According to a preferred embodiment the step of providing a phantom comprises providing the phantom with the resonating volumes of each plane being arranged with a uniform angular distance to each other. This distribution of the resonating volumes enables the field mapping with a high accuracy at minimum computational effort for processing the measurements. In case the planes are provided with different numbers of resonating volumes, the angular distance can be different for the different planes.

According to a preferred embodiment the step of providing a phantom comprises providing the phantom with the resonating volumes of different planes being arranged at different angular positions. The angular positions refer to a rotation of the resonating volumes of different planes relative to each other or in relation to a common coordinate system. This results in the resonating volumes of the respective planes being easily identifiable with the MR imaging system when performing a spectroscopic MR measurement. In general, an absolute angular position of the resonating volumes is not important. The difference of the angular positions depends on the diameter of the phantom and the number of resonating volumes distributed in a plane. Preferably, respective planes have an angular difference which is a half of the angle between resonating volumes of one plane. Accordingly, the resonating volumes of different planes can be identified by their angular positions, which are known due to the known phantom, even when the radial distance from the longitudinal axis of the phantom is identical. Accordingly, when spectroscopic measurements of resonating volumes cover resonating volumes of different rings due to backfolding, the resonating volumes can be reliably identified. The effect of backfolding, which is usually not desired, can be used with this phantom to reduce the number of spectroscopic measurements in the longitudinal axis of the phantom, which corresponds to the longitudinal axis, i.e. the z-axis, of the MR imaging system when placed therein. The planes for applying the rotational difference are preferably chosen among planes that show up in a single spectroscopic measurement. Accordingly, depending on the parameters of the measurement and the size of the phantom, the different angular positions may be applied to different planes over the phantom. Further preferred, the angular positions vary for multiple planes together.

According to a preferred embodiment the step of providing a phantom comprises providing the phantom with a distance between the parallel planes in a center region of the phantom being bigger than the distance between the parallel planes at a border region of the phantom. Therefore, also the angular difference between resonating volumes can be equally distributed in planes including the longitudinal axis of the phantom, i.e. planes rectangular to the x/y-plane. In the border regions, the diameter of the phantom in adjacent planes shows bigger variations than in its center region, so that the resonating volumes of the different planes can easily be distinguished from the resonating volumes of other planes, even in the presence of backfolding.

In another aspect of the present invention, the object is achieved by a magnetic resonance (MR) imaging system, comprising a main magnet for generating a static magnetic field, a magnetic gradient coil system for generating gradient magnetic fields superimposed to the static magnetic field, an examination space provided to position a subject of interest within, at least one radio frequency (RF) antenna device that is provided for applying an RF field to the examination space to excite nuclei of the subject of interest, and a control unit for controlling the operation of the at least one RF antenna device, whereby the magnetic resonance imaging system is configurable to perform three dimensional MR spectroscopic measurements, and the control unit is configurable to perform the above method. The MR imaging system can be used together with the above phantom to perform the above method for determining the static magnetic field of its main magnet. This facilitates installation and maintenance of the MR imaging system.

In another aspect of the present invention, the object is achieved by a field mapping system for evaluating a magnetic field, in particular of a MR imaging system, comprising a phantom with a set of resonating volumes positioned in a base body, whereby the base body has a spherical or ellipsoid shape in accordance with a volume of interest of the MR imaging system, and the resonating volumes are located at a circumference of the base body, and a control device for operating the MR imaging system, whereby the control device is adapted to perform the above method using the magnetic resonance (MR) imaging system.

In another aspect of the present invention, the object is achieved by a software package for upgrading a magnetic resonance (MR) imaging system, whereby the software package contains instructions for controlling the MR imaging system according to the above method.

Alternatively, a MR imaging system can be initially provided to perform the above method. Accordingly, the software package can be part of the initial software of the MR imaging system, in particular, the software package can be part of a control unit of the MR imaging system.

In one aspect of the present invention, the object is achieved by a phantom for use in a magnetic resonance (MR) imaging system with a set of resonating volumes positioned in a base body, whereby the base body has a spherical or ellipsoid shape in accordance with a volume of interest of the MR imaging system, and the resonating volumes are located at a circumference of the base body and arranged in different planes, which are arranged in parallel to each other, whereby the resonating volumes of each plane are arranged with a uniform angular distance to each other, and the resonating volumes of different planes are arranged at different angular positions.

Such a phantom can be provided with low costs and is easy to handle. The phantom is stationary, i.e. it does not have any moving parts and it does not have to be moved, so that the risk of damage or malfunction is low compared to a movable apparatus. With the resonating volumes at the circumference of the phantom, the phantom enables the determination of the magnetic field within the entire volume of interest. The determination of the magnetic field is also referred to as field mapping.

The base body is preferably made of plastics, e.g. of polycarbonate. The base body can have any suitable structure. Preferably, it is provided as an essentially hollow body. Alternatively, resonating volumes can be interconnected within the base body, with the resonating volumes defining the shape of the base body. In an alternative embodiment, the base body is made of another material, which is electrically non-conducting and has a low magnetic susceptibility.

The resonating volumes are provided within the base body. Preferably, the resonating volumes are provided by enclosures of a resonating medium within the base body. The resonating medium is a medium generating a magnetic resonance when subjected to the appropriate combination of a static magnetic field and a RF field. The resonating volumes have any size and shape suitable to be easily detected as separate volumes. Preferably, the resonating volumes have a spherical shape with a diameter of less than one centimeter, further preferred with a diameter of two to three millimeters. The base body can be provided with bores, which are filled with the resonating medium and sealed afterwards. Preferably, the resonating medium is water. Since the resonating volumes are provided at the circumference of the base body, a magnetic field at this circumference can be evaluated.

The circumferential magnetic field is suitable to determine the magnetic field within the entire phantom, i.e. the volume enclosed by the set of sample volumes. Accordingly, only a low number of resonating volumes is required. Resonating volumes within the entire circumference of the phantom are not required. Preferably, the resonating volumes are evenly distributed over the circumference of the base body and have the same volume. A typical volume of interest within a whole-body MR imaging system has a spherical shape with a diameter of about 50 cm. For this typical volume of interest it is preferred to have the phantom with at least 100 resonating volumes. Further preferred, the number of resonating volumes is at least 200. This enables a sufficient mapping of the magnetic field without excessive measuring effort, since the measuring effort increases with the number of resonating volumes.

Accordingly, the resonating volumes are arranged in circular or elliptic rings. The arrangement in planes facilitates the manufacturing of the phantom and the placement of the phantom within the volume of interest. The arrangement can be realized by placing the resonating volumes of each plane in a circular, elliptic, or annular structure, whereby the structures of all planes are connected together to form the phantom. The planes can be provided with a constant distance between each pair of planes, or the distance can be different for different pairs of planes. Further preferred, the locations of the rings correspond to the foot-points of an $n^{th}$ order Gaussian integration in $\theta$ direction, where $\theta$ is the spherical angular coordinate in the z-r plane and n is the number of rings. These angles are the zero points of the Legendre polynomial of order n. Preferably, the structure is a ring having a homogenous cross section in its circumferential direction such that all resonating volumes have the same susceptibility-related frequency shift. Further preferred, all resonating volumes are provided in ring structures having the same cross section. A preferred phantom has 20 to 30 planes, further preferred 24 planes. Preferably, each plane has a maximum of 20 to 30 resonating volumes. Since the center region of the phantom has a bigger diameter than its border region, it is preferred that the planes of the center region are provided with a higher number of resonating volumes compared to the border regions. In the method, the step of placing the phantom in the MR scanner comprises aligning the phantom, such that the rings are approximately coaxial with the longitudinal axis of the main magnet and the symmetry plane perpendicular to the axis or rotational symmetry of the phantom approximately coincides with the corresponding symmetry plane of the main magnet.

This distribution of the resonating volumes with a uniform angular distance to each other enables the field mapping with a high accuracy at minimum computational effort for processing the measurements. In case the planes are provided with different numbers of resonating volumes, the angular distance can be different for the different planes.

The angular positions refer to a rotation of the resonating volumes of different planes relative to each other or in relation to a common coordinate system. This results in the resonating volumes of the respective planes being easily identifiable with the MR imaging system when performing a spectroscopic MR measurement. In general, an absolute angular position of the resonating volumes is not important. The difference of the angular positions depends on the diameter of the phantom and the number of resonating volumes distributed in a plane. Preferably, respective planes have an angular difference which is a half of the angle between resonating volumes of one plane. The resonating volumes of different planes can be identified by their angular positions, which are known due to the known phantom, even when the radial distance from the longitudinal axis of the phantom is identical. Accordingly, when spectroscopic measurements of resonating volumes cover resonating volumes of different rings due to backfolding, the resonating volumes can be reliably identified. The effect of backfolding, which is usually not desired, can be used with this phantom to reduce the number of spectroscopic measurements in the longitudinal axis of the phantom, which corresponds to the longitudinal axis, i.e. the z-axis, of the MR imaging system when placed therein. With the different angular positions of the resonating volumes of different planes, crosstalk of the resonating volumes of different planes can be reduced. The planes for applying the rotational difference are preferably chosen among planes that show up in a single spectroscopic measurement. Accordingly, depending on the parameters of the measurement and the size of the phantom, the different angular positions may be applied to different planes over the phantom. Further preferred, the angular positions vary for multiple planes together.

The mapping of the field of the MRI magnet comprises following steps, as already discussed before: the phantom in placed in the main magnet of an MR scanner. An MRI scan is then performed in such a way that each of the individual resonant volumes can be identified and such that the NMR resonance frequency of each of the resonance volumes is obtained. The preferred imaging technique for this is a so-called 3D spectroscopic imaging sequence, where all spatial information is obtained by using phase encoding gradients. The resonance frequency thus found for each resonant volume is a measure for the field of the magnet at that location. The set of measurements is processed by a computer such as to produce a table, assigning a measured field value to each of the locations of the resonant volumes.

This field map can then be further processed to analyze the characteristics of the field inside the volume of interest and to determine corrective actions required to make the field of the magnet homogeneous.

According to a preferred embodiment the distance between the parallel planes in a center region of the phantom is bigger than the distance between the parallel planes at a border region of the phantom. Therefore, also the angular difference between resonating volumes can be equally distributed in planes including the longitudinal axis of the phantom, i.e. planes rectangular to the x/y-plane.

BRIEF DESCRIPTION OF THE DRAWINGS

These and other aspects of the invention will be apparent from and elucidated with reference to the embodiments described hereinafter. Such an embodiment does not necessarily represent the full scope of the invention, however, and reference is made therefore to the claims and herein for interpreting the scope of the invention.

In the drawings.

DETAILED DESCRIPTION OF EMBODIMENTS

Figure 1:
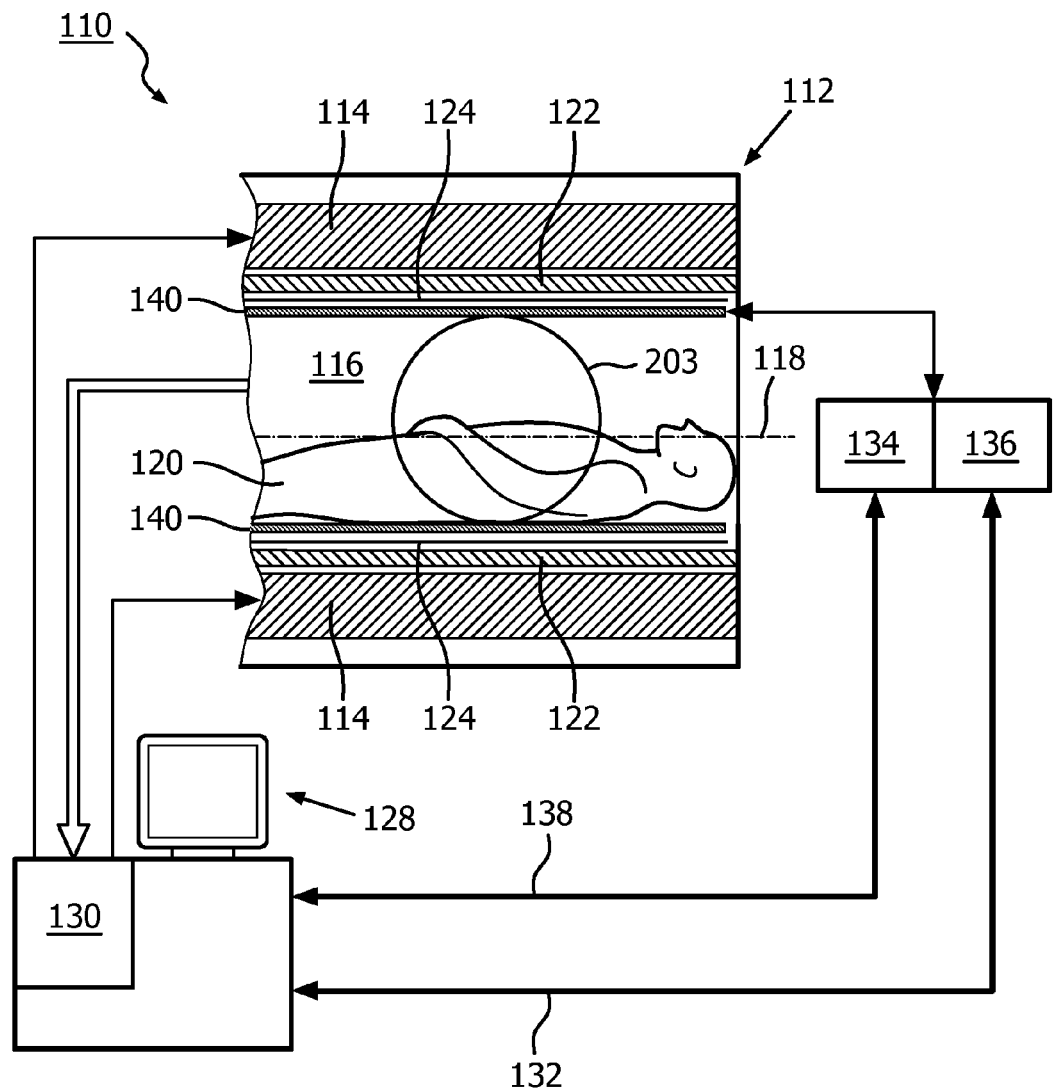
FIG. 1 is a schematic illustration of a part of an embodiment of a magnetic resonance (MR) imaging system in accordance with the invention.

FIG. 1 shows a schematic illustration of a part of an embodiment of a magnetic resonance (MR) imaging system 110 comprising an MR scanner 112. The MR imaging system 110 includes a main magnet 114 provided for generating a static magnetic field. The main magnet 114 has a central bore that provides an examination space 116 around a center axis 118 for a subject of interest 120, usually a patient, to be positioned within. In an alternative embodiment a different type of MR imaging system providing an examination region within a static magnetic field is used. Further, the MR imaging system 110 comprises a magnetic gradient coil system 122 provided for generating gradient magnetic fields superimposed to the static magnetic field. The magnetic gradient coil system 122 is concentrically arranged within the bore of the main magnet 114, as known in the art.

Further, the MR imaging system 110 includes a radio frequency (RF) antenna device 140 designed as a whole-body coil having a tubular body. The RF antenna device 140 is provided for applying an RF magnetic field to the examination space 116 during RF transmit phases to excite nuclei of the subject of interest 120. The RF antenna device 140 is also provided to receive MR signal from the excited nuclei during RF receive phases. In a state of operation of the MR imaging system 110, RF transmit phases and RF receive phases are taking place in a consecutive manner. The RF antenna device 140 is arranged concentrically within the bore of the main magnet 114. As is known in the art, a cylindrical metal RF screen 124 is arranged concentrically between the magnetic gradient coil system 122 and the RF antenna device 140.

Moreover, the MR imaging system 110 comprises an MR image reconstruction unit 130 provided for reconstructing MR images from the acquired MR signals and an MR imaging system control unit 126 with a monitor unit 128 provided to control functions of the MR scanner 112, as is commonly known in the art. Control lines 132 are installed between the MR imaging system control unit 126 and an RF transmitter unit 134 that is provided to feed RF power of an MR radio frequency to the RF antenna device 140 via an RF switching unit 136 during the RF transmit phases. The RF switching unit 136 in turn is also controlled by the MR imaging system control unit 126, and another control line 138 is installed between the MR imaging system control unit 126 and the RF switching unit 136 to serve that purpose. During RF receive phase, the RF switching unit 136 directs the MR signals from the RF antenna device 140 to the MR image reconstruction unit 130 after pre-amplification.

Figure 2:
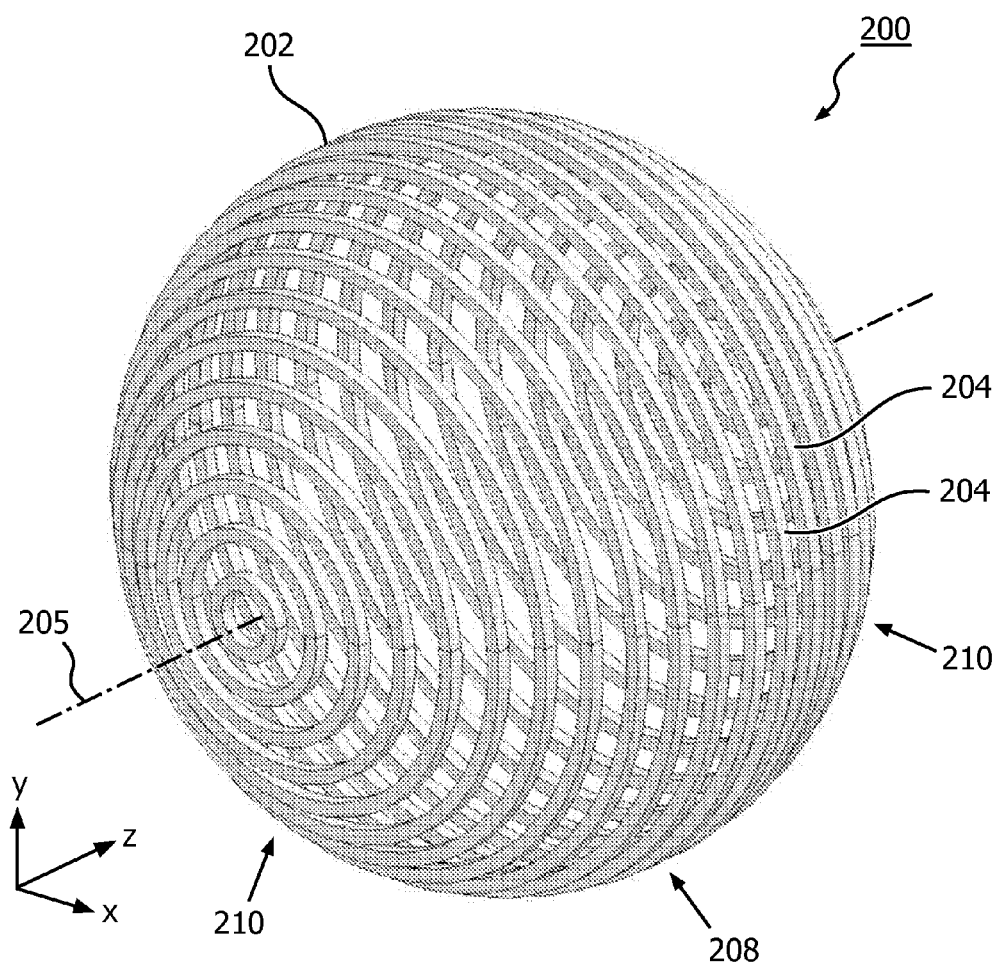
FIG. 2 is an illustration of a phantom having a spherical shape in accordance with the invention.
Figure 3:
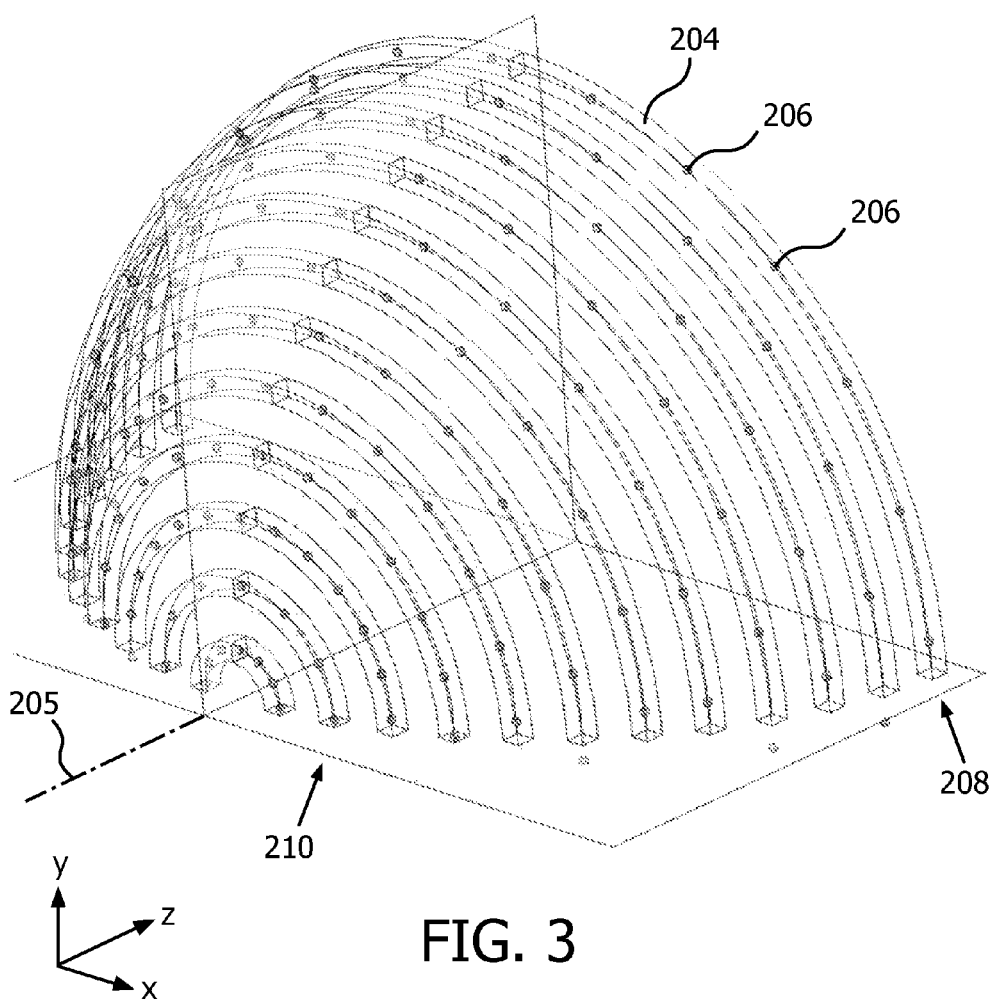
FIG. 3 is a partial view of the phantom of FIG. 2 showing half a hemisphere of rings forming a base body thereof and with resonating volumes in the ring.

FIGS. 2 and 3 show a phantom 200 according to a preferred embodiment for use in the MR imaging system 110. The phantom 200 comprises a base body 202 having a spherical shape in accordance with a volume of interest 203 of the MR imaging system 110. The volume of interest 203 is part of the examination space 116. For a typical MR imaging system 110 the volume of interest has a diameter of about 50 to 60 centimeters, which is also the diameter of the phantom 200.

The base body 202 is an essentially hollow body, which is formed by a set of 24 circular rings 204, each of which having the same rectangular cross-section, as can be seen in FIG. 3. The rings 204 are made of polycarbonate and define a circumference of the base body 202. The rings 204 have a common rotational axis 205, which is also referred to as z-axis.

Each ring 204 defines a plane, and the planes are located in parallel to each other. The distance between the rings 204 in a center region 208 of the phantom 200 is bigger than the distance between the rings 204 in a border region 210 of the phantom 200, and the rings 204 in the center region 208 have a bigger diameter than the rings 204 in the border region 210, thereby providing the spherical shape of the phantom 200.

Resonating volumes 206 are provided within the rings 204 as enclosures of a resonating medium, which is water in this embodiment. The water is filled into bores within the rings 204, and the bores are sealed with a plug after receiving the water. The bores are drilled with a tool with a tip angle of 120 degrees, and the bottom face of the plug is also drilled with this tool, so that the enclosed water volumes each have an approximately spherical shape with a diameter of 3 mm. The bores of each ring 204 are positioned with equal angular distances between each other. The rings 204 in the center region 208 have 24 resonating volumes 206, and the rings 204 in the border region 210 have 12 resonating volumes 206. Overall, the resonating volumes 206 are evenly distributed over the circumference of the base body 202, where the resonating volumes 206 of adjacent rings 204 are arranged with the same angular difference in planes including the z-axis of the phantom 200.

As can be seen in table 1, the resonating volumes 206 of different rings 204 are arranged with different angular positions. Details regarding the angular positions will be explained further below.

Now will be described a method for evaluating the magnetic field of the main magnet 114 of the MR imaging system 110. The MR imaging system 110 is capable of performing a 3D spectroscopic MR measurement.

The phantom 200 is provided and placed within the Volume of interest 203 with its z-axis 205 aligned with the center axis 118 of the MR imaging system 110. Accordingly, the rings 204 of the base body 202 are accurately positioned in planes in the x/y-direction of the MR imaging system 110.

Next, the MR imaging system 110 executes a 3D spectroscopic measurement with three phase-encoding directions. The 3D spectroscopic MR measurement refers to a measurement of detailed resonance frequencies at each measurement point. The particular frequency of a magnetic resonance of the water of a resonating volume 206 indicates the strength of the magnetic field at the location of this resonating volume 206. The resolution in the x/y-direction of the MR imaging system is chosen to be 120×120 individual measurement points, requiring 120 phase encoding steps in x and y directions. The number of phase encoding steps in z-direction is set to be 10, resulting in 10 image slices in z-direction. In the measurement, backfolding leads to superposition of the information of 2-4 rings 204 in one slice. A measurement sequence with only phase-encoding gradients is used, so that the geometric distortion of the measurement is only determined by gradient non-linearity.

After performing the measurement, the measured resonances are assigned to the resonating volumes 206. Accordingly, the measured resonance of each resonating volume 206 is identified in at least one of the individual measurements. Therefore, each resonating volume 206 is identified based on the position of its measured signal in the 3D image, using catch zones within the spectroscopic MR measurement of the phantom 200. The identified frequency of the spectroscopic measurement within this catch zone is then used as spectroscopic measurement from the resonating volume 206 corresponding to the catch zone. The catch zones are defined based on the known positions of the resonating volumes 206 and a known field profile of the gradient coil of the MR imaging system 110 and the parameters of the scan sequence.

Figure 4:
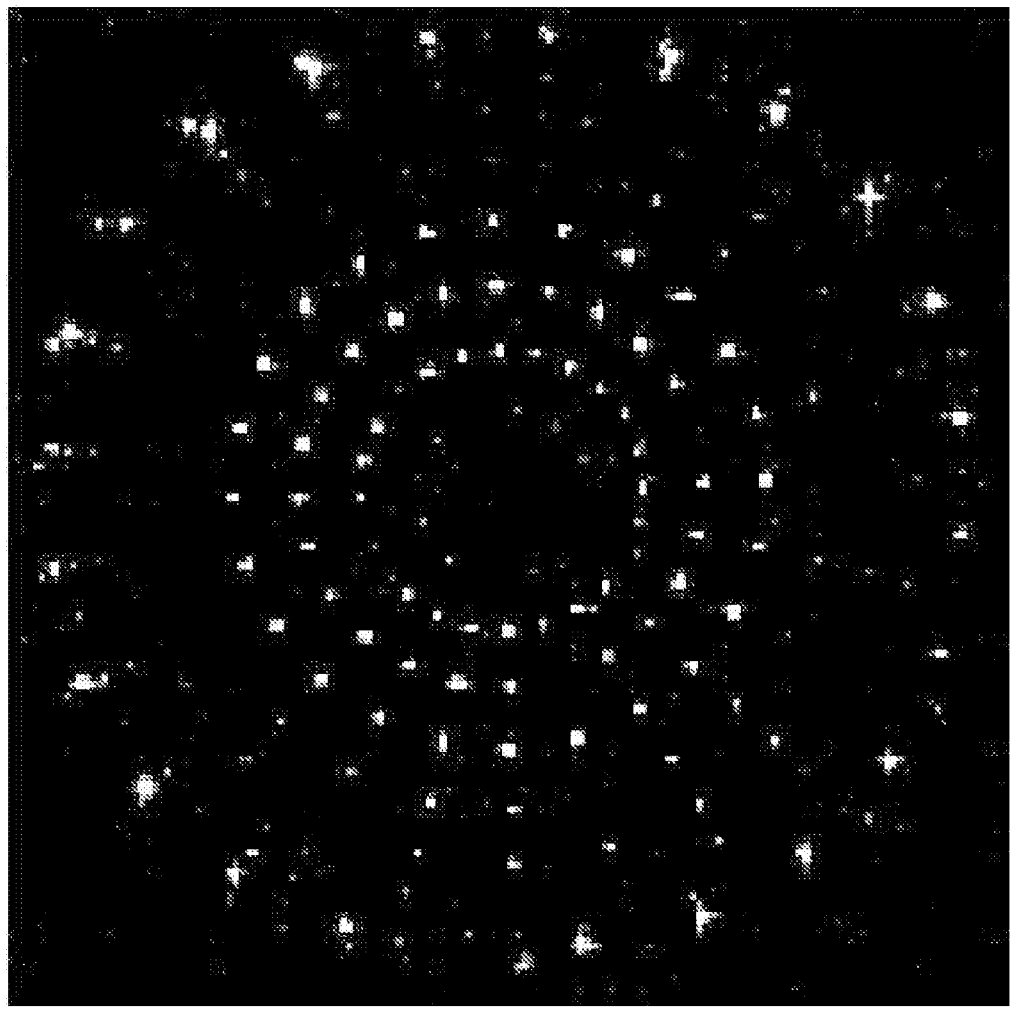
FIG. 4 is an illustration showing a visualization of measurement results from resonating volumes of different rings taken by a single measurement in the z-axis.

The phase encoding steps in z-direction are selected and performed to allow signal reconstruction for rings having the indexes 8 through 17, as shown in table 1. With the 10 phase-encoding steps in z-axis 205, reconstruction of these 10 rings 204 is possible. Each reconstructed slice is in the z-axis 205 approximately centered at the position of the respective single ring 204. Due to intra-slice cross talk, each slice also contains the information of adjacent rings 204. For example, slice 5 not only contains the image of ring 204 with index 12 but also of the neighboring rings 204 having indexes 11 and 13, as illustrated in FIG. 4. FIG. 4 shows the result for one phase encoding step in z-direction with multiple resonances referring to resonating volumes 206 of different rings 204.

Identification of the resonating volumes 206 based on the position of its measured resonance is performed. As can be seen in FIG. 4, the position is unique including an angular and a radial position. The image of ring 204 with index 12 is distinguished from unwanted information of rings 204 with indexes 11 and 13 due to their relative angular offset of 7.5 degrees. The rings 204 located outside the area covered by the 3D spectroscopic MR scan with the 10 phase encoding steps show up in the MR measurement due to backfolding. As a further example, the image of the ring 204 with index 7 is superimposed on the image of the ring 204 with index 17 in slice 10, as indicated in table 1. Although the rings 204 with indexes 7 and 17 have nearly identical diameters, they are distinguished by their angular offset of 7.5.

As shown in table 1, a discontinuity in the alternating angular position scheme appears between the rings 204 with index 8 and index 7, since these two rings 204 have the same angular position. Since the image of the ring 204 with index 18 is superimposed on the image of ring 204 with index 8 in slice 1, a relative angular offset of 7.5 degrees is wanted to distinguish these two rings 204. Hence, ring 204 with index 18 has the same angular position as ring 204 with index 17. As the separation between the rings 204 of the phantom 200 along the z-axis 205 becomes smaller on approaching the border regions 210 of the phantom 200, groups of multiple adjacent rings 204 of the border region 210 appear together in the same slice. For example, rings 204 with indexes 4 and 5 both appear in slice 8, superimposed on the image of the ring 204 with index 15. Because of this superposition of image information, an angular offset of 7.5 degrees between rings 204 with indexes 4 and 5 is provided. The first three rings 204 with indexes 1 to 3 at the border region 210 of the phantom 200 appear in slice 7, superimposed on the image of the ring 204 with index 14. The first three rings 204 with indexes 1 to 3 are distinguished by radius, so that the angular position is freely chosen, since it is not required to separate these rings 204. The same applies for the final three rings 204 with indexes 22 to 24 at the other border region 210 of the phantom 200.

TABLE 1 ring numbers of the phantom, the slices of the image in which they appear and the applied angular offsets

| ring | plane | angle |
|---|---|---|
| 1 | 7 | 15 |
| 2 | 7 | 15 |
| 3 | 7 | 7.5 |
| 4 | 8 | 3.25 |
| 5 | 8 | −3.25 |
| 6 | 9 | 3.25 |
| 7 | 10 | −3.25 |
| 8 | 1 | −3.25 |
| 9 | 2 | 3.25 |
| 10 | 3 | −3.25 |
| 11 | 4 | 3.25 |
| 12 | 5 | −3.25 |
| 13 | 6 | 3.25 |
| 14 | 7 | −3.25 |
| 15 | 8 | 3.25 |
| 16 | 9 | −3.25 |
| 17 | 10 | 3.25 |
| 18 | 1 | 3.25 |
| 19 | 2 | −3.25 |
| 20 | 3 | 3.25 |
| 21 | 3 | −3.25 |
| 22 | 4 | 7.5 |
| 23 | 4 | 15 |
| 24 | 4 | 15 |

It will be obvious, that in other embodiments having other values for the number of rings 204 of the phantom 200, the size of the volume of interest 203 and the number of phase encoding steps of the 3D image, the of angular positions of the rings 204 is chosen differently.

Finally, when the resonance frequencies of all resonating volumes 206 are known, the magnetic field of the main magnet 114 is evaluated. From the measured resonances of the resonating volumes 206, the magnetic field of the main magnet 114 at the locations of the resonating volumes 206 is calculated. With the magnetic field known at the circumference of the volume of interest 203, the static magnetic field within the entire volume of interest 203 is determined.

Using this phantom 200 with the described method, the MR imaging system 110 is used directly for determining the magnetic field of its main magnet 116. Processing steps subsequent to the measurement of the spectroscopic 3D measurement are in one embodiment performed using a separate control device, which is connected to the MR imaging system 110. Accordingly, the phantom 200 and the control device form a field mapping system for evaluating a magnetic field of a magnetic resonance (MR) imaging system 110 is provided, whereby the control device is adapted to perform the above method using the magnetic resonance (MR) imaging system 110.

In an alternative embodiment, the method steps are controlled directly by the control unit 126 of the MR imaging system 110, or by a separate unit dedicated to performing the method.

The method according to this embodiment is implemented in software executed within the control unit 126 or the control device. In particular, a software package for upgrading the MR imaging system 110 is provided for executing the method in the control unit 126, whereby the software package contains instructions for controlling the MR imaging system 110 according to the above method.

In an alternative embodiment, the software package is integral part of a control software of the control unit 126 of the MR imaging system 110.

While the invention has been illustrated and described in detail in the drawings and foregoing description, such illustration and description are to be considered illustrative or exemplary and not restrictive; the invention is not limited to the disclosed embodiments. Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage. Any reference signs in the claims should not be construed as limiting the scope.

REFERENCE SYMBOL LIST 110 magnetic resonance (MR) imaging system
112 magnetic resonance (MR) scanner
114 main magnet
116 RF examination space
118 center axis
120 subject of interest
122 magnetic gradient coil system
124 RF screen
126 MR imaging system control unit
128 monitor unit
130 MR image reconstruction unit
132 control line
134 RF transmitter unit
136 RF switching unit
138 control line
140 radio frequency (RF) antenna device
200 phantom
202 base body
203 volume of interest
204 ring
205 rotational axis, z-axis
206 resonating volume
208 center region
210 border region

The invention claimed is:

1. A method for evaluating a magnetic field of a main magnet of a magnetic resonance (MR) imaging system, comprising the steps of
providing a phantom with a set of resonating volumes positioned in a base body, wherein the base body has a spherical or ellipsoidal shape and comprises a plurality of rings in accordance with a volume of interest of the MR imaging system, and the resonating volumes are located at a circumference of the base body, the resonating volumes having a spherical shape,
positioning the phantom within the main magnet,
performing a 3D spectroscopic MR measurement of the phantom in which all spatial information is encoded by phase encoding gradients, using the MR imaging system, thereby measuring resonances of the resonating volumes,
assigning the measured resonances to the resonating volumes, and
evaluating the magnetic field of the main magnet from the MR measurement of the phantom based on the measured resonances of the resonating volumes.

2. The method of claim 1, wherein
the assigning the measured resonances to the resonating volumes comprises identifying the measured resonances in a spatial domain.

3. The method of claim 1, wherein
the assigning the measured resonances to the resonating volumes comprises generating a catch zone for each resonating volume within the 3D spectroscopic MR measurement.

4. The method of claim 1, wherein
the providing a phantom comprises providing the phantom with the resonating volumes being arranged in different planes, which are arranged in parallel to each other.

5. The method of claim 4, wherein
the providing a phantom comprises providing the phantom with the set of resonating volumes of each plane being arranged with a uniform angular distance to each other.

6. The method of claim 4, wherein
the providing a phantom comprises providing the phantom with the set of resonating volumes of different planes being arranged at different angular positions.

7. The method of claim 4, wherein
the providing a phantom comprises providing the phantom with a distance between the parallel planes in a center region of the phantom being bigger than the distance between the parallel planes at a border region of the phantom.

8. A magnetic resonance imaging system, comprising
a main magnet for generating a static magnetic field,
a magnetic gradient coil system for generating gradient magnetic fields superimposed to the static magnetic field,
an examination space provided to position a subject of interest within,
at least one radio frequency (RF) antenna device that is provided for applying an RF field to the examination space to excite nuclei of the subject of interest, and
a control unit for controlling the operation of the at least one RF antenna device,
wherein
the magnetic resonance (MR) imaging system is configurable to perform three dimensional MR spectroscopic measurements, and the control unit is configurable to perform the method of claim 1.

9. A field mapping system for evaluating a magnetic field of a magnetic resonance imaging system, comprising
- a phantom with a set of resonating volumes positioned in a base body, wherein the base body has a spherical or ellipsoidal shape in accordance with a volume of interest of the MR imaging system, and the resonating volumes are located at a circumference of the base body,
- a control device for operating magnetic resonance imaging system, wherein the control device is adapted to perform the method of claim 1 using the magnetic resonance imaging system.

10. The field mapping system of preceding claim 9, wherein the distance between the parallel planes in a center region of the phantom is bigger than the distance between the parallel planes at a border region of the phantom.

11. A software package for upgrading a magnetic resonance (MR) imaging system, wherein the software package contains instructions for controlling the MR imaging system according to claim 1.

12. A phantom for use in a magnetic resonance (MR) imaging system with a set of resonating volumes positioned in a base body, the resonating volumes being located at a circumference of the base body and arranged in different planes, which are arranged in parallel to each other, wherein the set of resonating volumes of each plane are arranged with a uniform angular distance to each other, the base body having a spherical or ellipsoidal shape, and comprising a plurality of rings in accordance with a volume of interest of the MR imaging system, and the set of resonating volumes of different planes are arranged at different angular positions, wherein all spatial information used to obtain a 3D spectroscopic MR measurement of the phantom is obtained using phase encoding gradients.

13. The phantom of claim 12, wherein the distance between the parallel planes in a center region of the phantom is bigger than the distance between the parallel planes at a border region of the phantom.

14. The phantom of claim 12, wherein the different planes are arranged in parallel to each other.

15. The phantom of claim 14, wherein the resonating volumes of each plane is arranged with a uniform angular distance to each other.

16. The method of claim 1, wherein each of the plurality of rings has the same rectangular cross-section.

17. The phantom of claim 12, wherein each of the plurality of rings has the same rectangular cross-section.

18. The method of claim 4, wherein each of the planes is defined by a respective one of the plurality of rings.

19. The phantom of claim 12, wherein each of the planes is defined by a respective one of the plurality of rings.

* * * * *